(12) United States Patent
Nishida

(10) Patent No.: US 6,557,158 B1
(45) Date of Patent: Apr. 29, 2003

(54) SCHEDULING METHOD FOR HIGH-LEVEL SYNTHESIS AND RECORDING MEDIUM

(75) Inventor: Koichi Nishida, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/502,013

(22) Filed: Feb. 11, 2000

(30) Foreign Application Priority Data

Jun. 3, 1999 (JP) .......................................... 11-157196

(51) Int. Cl.$^7$ ............................................. G06F 17/50
(52) U.S. Cl. ....................................................... 716/18
(58) Field of Search .......................................... 716/18

(56) References Cited

U.S. PATENT DOCUMENTS

| | | | |
|---|---|---|---|
| 5,487,017 A | | 1/1996 | Prasad et al. |
| 5,502,645 A | * | 3/1996 | Guerra et al. .................. 716/18 |
| 5,513,118 A | * | 4/1996 | Dey et al. ....................... 716/18 |
| 5,550,749 A | * | 8/1996 | Dey et al. ....................... 716/18 |
| 5,557,797 A | * | 9/1996 | Yano ............................. 717/4 |
| 5,706,205 A | * | 1/1998 | Masuda et al. ................ 716/18 |
| 5,787,010 A | | 7/1998 | Schaefer et al. |

FOREIGN PATENT DOCUMENTS

| | | | |
|---|---|---|---|
| GB | 2 279 785 A | | 1/1995 |
| GB | 2 350 914 | * | 12/2000 ........... G06F/17/50 |
| JP | 09081605 | | 3/1997 |

OTHER PUBLICATIONS

P.G. Paulin et al., Force–directed scheduling for the Behavioral Synthesis of ASICs, IEEE Transactions on Computer–Aided Design of Integrated Circuits and Systems, pp. 661–679, Jun. 1989.*

P.G. Paulin et al., Scheduling and Binding Algorithms for High Level Synthesis, Proceedings of the 1989 26$^{th}$ ACM/IEEE Conference on Design Automation, pp. 1–6, 1989.*

R. Cloutier et al., The combination of Scheduling, Allocation, and mapping in A Single Algorithm, 27$^{th}$ ACM/IEEE Design Automation Conference, pp. 71–76, 1991.*

P.G. Paulin et al., Force–Directed Scheduling in Automatic Data Path Synthesis, 24$^{th}$ ACM/IEEE Design Automation Conference, pp. 195–202, 1987.*

"Force–Directed Heuristic Method", Daniel D. Gajski, et al., *High–Level Synthesis—Introduction to Chip and System Design*, (1992).

* cited by examiner

Primary Examiner—Matthew Smith
Assistant Examiner—A. M. Thompson
(74) Attorney, Agent, or Firm—Birch, Stewart, Kolasch & Birch, LLP

(57) ABSTRACT

The present invention relates to a scheduling method and apparatus for high-level synthesis of a circuit which is represented by an operation description. The method includes calculating a probability for each of a plurality of nodes included in a control flow graph to be assigned to a time step and calculating a sum of the probabilities for each time step. For each node having a scheduling candidate in a time step for which the sum of probabilities is maximum, an estimated value of an area of the circuit is calculated with the node having been temporarily assigned to the scheduling candidate and a combination of a node and a scheduling candidate for which the estimated value is maximum is retrieved. Finally, a list of scheduling candidates of the node in the combination is narrowed down by excluding the scheduling candidate in the combination from the list of scheduling candidates of the node in the combination.

4 Claims, 14 Drawing Sheets

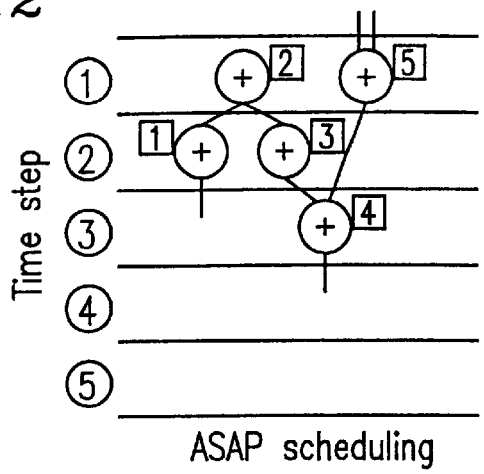
FIG. 2 ASAP scheduling
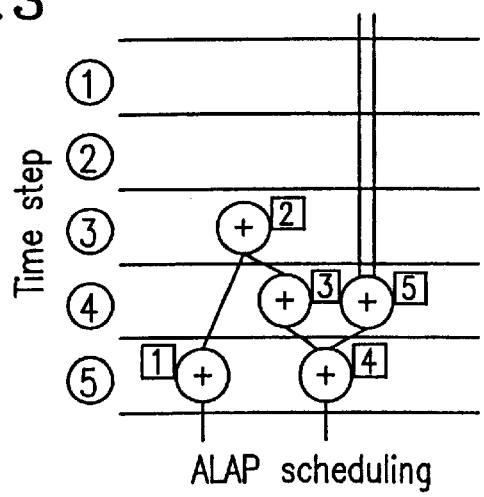
FIG. 3 ALAP scheduling
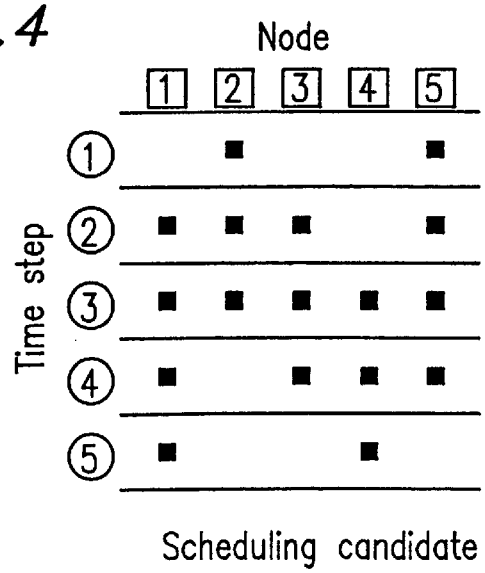
FIG. 4 Scheduling candidate

FIG.5

|  | Node 1 | Node 2 | Node 3 | Node 4 | Node 5 |
|---|---|---|---|---|---|
| ① |  | 1/3 |  | 1/4 |  |
| ② | 1/4 | 1/3 | 1/3 |  | 1/4 |
| ③ | 1/4 | 1/3 | 1/3 | 1/3 | 1/4 |
| ④ | 1/4 |  | 1/3 | 1/3 | 1/4 |
| ⑤ | 1/4 |  |  | 1/3 |  |

Time step

Probability of each node

FIG.6

|  | Node 1 | Node 2 | Node 3 | Node 4 | Node 5 | Sum of probabilities |
|---|---|---|---|---|---|---|
| ① |  | 1/3 |  | 1/4 |  | 0.58 |
| ② | 1/4 | 1/3 | 1/3 |  | 1/4 | 1.16 |
| ③ | 1/4 | 1/3 | 1/3 | 1/3 | 1/4 | (1.5) |
| ④ | 1/4 |  | 1/3 | 1/3 | 1/4 | 1.16 |
| ⑤ | 1/4 |  |  | 1/3 |  | 0.58 |

Time step

Probability of each node

FIG. 9

```
        Area estimation
              ↓
┌─────────────────────────────────┐
│ Calculate probability of each node │─13
│ after temporary assignment         │
└─────────────────────────────────┘
              ↓
┌─────────────────────────────────┐
│ Calculate sum of probabilities     │─14
│ for each time step                 │
└─────────────────────────────────┘
              ↓
┌─────────────────────────────────┐
│ Calculate maximum value among      │─15
│ sums of probabilities              │
└─────────────────────────────────┘
              ↓
            END
```

FIG. 10

| Time step | Node 1 | Node 2 | Node 3 | Node 4 | Node 5 | Sum of probabilities |
|---|---|---|---|---|---|---|
| ① |  | 1/2 |  |  | 1/4 | 0.58 |
| ② | 0 | 1/2 | 1/3 |  | 1/4 | 1.08 |
| ③ | 1 | 0 | 1/3 | 1/3 | 1/4 | (1.91) |
| ④ | 0 |  | 1/3 | 1/3 | 1/4 | 0.91 |
| ⑤ | 0 |  |  | 1/3 |  | 0.33 |

Probability of each node    Sum of probabilities

FIG.16

Scheduling candidate across Node 1–5 and Time step ①–⑤

FIG.17

Scheduling candidate across Node 1–5 and Time step ①–⑤

FIG.20

| Time step | Node 1 | Node 2 | Node 3 | Node 4 | Node 5 | Sum of probabilities |
|---|---|---|---|---|---|---|
| ① |  | 0 |  |  | 1/4 | 0.25 |
| ② | 0 | 0 | 0 |  | 1/4 | 0.25 |
| ③ | 0 | 1 | 0 | 0 | 1/4 | 1.25 |
| ④ | 1/2 |  | 1 | 0 | 1/4 | (1.75) |
| ⑤ | 1/2 |  | 1 |  |  | 1.5 |

Probability of each node

FIG.21

| Time step | Node 1 | Node 2 | Node 3 | Node 4 | Node 5 | Sum of probabilities |
|---|---|---|---|---|---|---|
| ① |  | 1/2 |  |  | 1/4 | 0.75 |
| ② | 1/4 | 1/2 | 0 |  | 1/4 | 1.00 |
| ③ | 1/4 | 0 | 1 | 0 | 1/4 | (1.50) |
| ④ | 1/4 |  | 0 | 1/2 | 1/4 | 1.00 |
| ⑤ | 1/4 |  |  | 1/2 |  | 0.75 |

Probability of each node

FIG.22

| Time step | Node 1 | 2 | 3 | 4 | 5 | Sum of probabilities |
|---|---|---|---|---|---|---|
| ① |  | 1 |  | 1/2 |  | (1.50) |
| ② | 1/4 | 0 | 1 | 1/2 |  | 0.75 |
| ③ | 1/4 | 0 | 0 | 1 | 0 | 1.25 |
| ④ | 1/4 |  | 0 | 0 | 0 | 0.25 |
| ⑤ | 1/4 |  | 0 |  |  | 0.25 |

Probability of each node

FIG.23

| Time step | Node 1 | 2 | 3 | 4 | 5 | Sum of probabilities |
|---|---|---|---|---|---|---|
| ① |  | 1/3 |  | 0 |  | 0.33 |
| ② | 1/4 | 1/3 | 1/3 | 0 |  | 0.91 |
| ③ | 1/4 | 1/3 | 1/3 | 0 | 1 | (1.91) |
| ④ | 1/4 |  | 1/3 | 1/2 | 0 | 1.08 |
| ⑤ | 1/4 |  |  | 1/2 |  | 0.75 |

Probability of each node

Scheduling candidate

| | Node 1 | Node 2 | Node 3 | Node 4 | Node 5 | Sum of probabilities |
|---|---|---|---|---|---|---|
| ① | | 1/2 | | | 1/4 | 0.75 |
| ② | 1/4 | 1/2 | 1/3 | | 1/4 | 1.33 |
| ③ | 1/4 | 0 | 1/3 | 1/3 | 1/4 | (1.16) |
| ④ | 1/4 | | 1/3 | 1/2 | 1/4 | 1.16 |
| ⑤ | 1/4 | | | 1/3 | | 0.58 |

Probability of each node

SCHEDULING METHOD FOR HIGH-LEVEL SYNTHESIS AND RECORDING MEDIUM

BACKGROUND OF THE INVENTION

1. Field of the Invention

The present invention relates to a scheduling method for high-level synthesis of a circuit which is represented by an operation description. More particularly, the present invention relates to a scheduling method for assigning a plurality of nodes included in a control flow graph respectively to a plurality of time steps so as to minimize the circuit area.

2. Description of the Related Art

In the prior art, "HIGH-LEVEL SYNTHESIS, Introduction to Chip and System Design (Kluwer Academic Publishers) 1992" describes a force-directed scheduling algorithm for performing a scheduling operation so as to minimize the circuit area. This algorithm calculates, for each time step, the sum of probabilities for a plurality of nodes included in a control flow graph to be assigned to that time step so as to estimate the circuit area (hereinafter, also referred to simply as the "area") based on the maximum value of the calculated sums.

Japanese Laid-Open Publication No. 9-81605 describes an algorithm which involves an improvement to the above force-directed scheduling algorithm. This algorithm gradually narrows down the scheduling candidates by calculating the estimated value of the circuit area, for each node (B) having scheduling candidate (A) in the time step for which the sum of probabilities is maximum, with the scheduling candidate (A) having been excluded from a list of one or more scheduling candidates of the node (B), so as to obtain a combination of a node (C) and a scheduling candidate (D) for which the circuit area is maximum, and then excluding the scheduling candidate (D) from a list of one or more scheduling candidates of the node (C). The algorithm described in Japanese Laid-Open Publication No. 9-81605 aims to solve a problem associated with the force-directed scheduling algorithm (i.e., the optimal time step may be excluded from the list of scheduling candidates when a plurality of nodes are assigned to time steps at once, thereby resulting in a local solution). Thus, the algorithm described in Japanese Laid-Open Publication No. 9-81605 gradually narrows down the scheduling candidates, thereby achieving better scheduling results than those obtained with the force-directed scheduling algorithm.

However, the algorithm described in Japanese Laid-Open Publication No. 9-81605 calculates; for each time step, the sum of probabilities for a plurality of nodes to be assigned to that time step, and calculates the estimated value of the circuit area, for each node (B) having scheduling candidate (A) in the time step for which the sum of probabilities is maximum, with the scheduling candidate (A) having been excluded from a list of one or more scheduling candidates of the node (B). Thus, the accuracy of the estimated value may not be sufficient, whereby the optimal time step may be excluded from the list of scheduling candidates, thereby resulting in a local solution.

Moreover, the algorithm described in Japanese Laid-Open Publication No. 9-81605 does not take into consideration the area of registers. Therefore, it is likely that even when the area of operators is reduced, the area of registers increases, thereby increasing the area of the entire circuit.

SUMMARY OF THE INVENTION

According to one aspect of this invention, there is provided a scheduling method for high-level synthesis of a circuit which is represented by an operation description. The method includes the steps of: (a) calculating a probability for each of a plurality of nodes included in a control flow graph to be assigned to a time step; (b) calculating a sum of the probabilities for each time step; (c) calculating, for each node having a scheduling candidate in a time step for which the sum of probabilities is maximum, an estimated value of an area of the circuit with the node having been temporarily assigned to the scheduling candidate; (d) retrieving a combination of a node and a scheduling candidate for which the estimated value is maximum: and (e) narrowing down a list of scheduling candidates of the node in the combination by excluding the scheduling candidate in the combination from the list of scheduling candidates of the node in the combination.

In one embodiment of the invention, the method further includes the step of determining whether or not there is more than one combination of a node and a scheduling candidate retrieved in the step (d) for which the estimated value is maximum. If it is determined that there is more than one such combination, the step (e) includes the steps of: (e-1) calculating a value of a predetermined evaluation function for each of the combinations; (e-2) retrieving a combination of a node and a scheduling candidate for which the value of the predetermined evaluation function is maximum; and (e-3) excluding the scheduling candidate in the combination from the list of scheduling candidates of the node in the combination.

In one embodiment of the invention, the evaluation function is represented by ((the number of inputs of the node)–(the number of outputs of the node)×(a time step number of the scheduling candidate).

According to another aspect of this invention, there is provided a computer-readable recording medium having a program recorded thereon for instructing a computer to execute a scheduling method for high-level synthesis of a circuit which is represented by an operation description. The scheduling method includes the steps of: (a) calculating a probability for each of a plurality of nodes included in a control flow graph to be assigned to a time step; (b) calculating a sum of the probabilities for each time step; (c) calculating, for each node having a scheduling candidate in a time step for which the sum of probabilities is maximum, an estimated value of an area of the circuit with the node having been temporarily assigned to the scheduling candidate; (d) retrieving a combination of a node and a scheduling candidate for which the estimated value is maximum; and (e) narrowing down a list of scheduling candidates of the node in the combination by excluding the scheduling candidate in the combination from the list of scheduling candidates of the node in the combination.

Thus, the invention described herein makes possible the advantage of: (1) providing a scheduling method for high-level synthesis capable of quickly and accurately calculating the estimated value of the circuit area; and (2) providing a scheduling method for fast high-level synthesis which takes into consideration the area of registers.

These and other advantages of the present invention will become apparent to those skilled in the art upon reading and understanding the following detailed description with reference to the accompanying figures.

BRIEF DESCRIPTION OF THE DRAWINGS

FIG. 2 illustrates results of an exemplary ASAP scheduling operation;

FIG. 3 illustrates results of an exemplary ALAP scheduling operation;

FIG. 4 illustrates the initial list of scheduling candidates for each node obtained through the ASAP and ALAP scheduling operations;

FIG. 5 illustrates the results of an exemplary probability calculation operation for nodes 1–5 to be assigned to each time step;

FIG. 6 illustrates the sum of probabilities calculated for each time step, with the maximum value among the calculated sums of probabilities being selected;

FIG. 9 illustrates a flow chart for an area estimation operation:

FIG. 10 illustrates the results of an exemplary area estimation operation after the temporary assignment;

FIG. 16 illustrates an example where a node is temporarily assigned to a time step;

FIG. 17 illustrates an example where a node is temporarily assigned to a time step;

FIG. 20 illustrates the results of an exemplary area estimation operation after the temporary assignment;

FIG. 21 illustrates the results of an exemplary area estimation operation after the temporary assignment;

FIG. 22 illustrates the results of an exemplary area estimation operation after the temporary assignment;

FIG. 23 illustrates the results of an exemplary area estimation operation after the temporary assignment;

DESCRIPTION OF THE PREFERRED EMBODIMENTS

Embodiments of the present invention will now be described with reference to the accompanying drawings.

Figure 1:
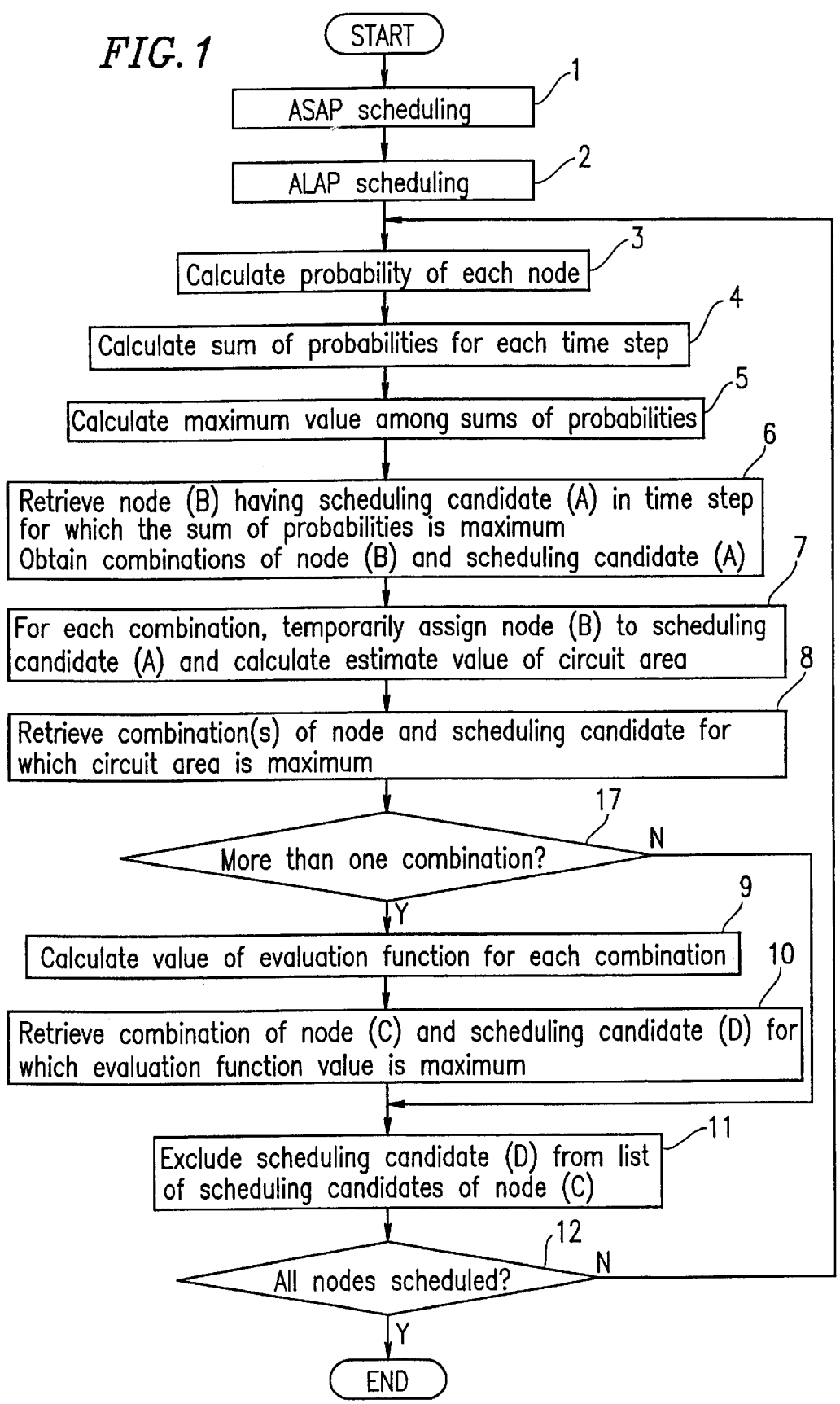
FIG. 1 is a flow chart of a scheduling method according to an embodiment of the present invention.

FIG. 1 is a flow chart illustrating a procedure of a scheduling method for high-level synthesis of a circuit which is represented by an operation description according to an embodiment of the present invention. Such a scheduling method can be suitably performed in, for example, an LSI high-level design CAD. Each step shown in the flow chart of FIG. 1 will now be described.

In Step 1, ASAP scheduling is performed. Specifically, each of a plurality of nodes included in a control flow graph is assigned to an earliest time step possible on the condition that a predetermined dependency between the nodes is satisfied.

FIG. 2 illustrates the results of an exemplary ASAP scheduling operation. In FIG. 2, the time steps are denoted by circled numbers 1–5 and arranged in the chronological order, and the nodes are denoted by boxed numbers 1–5. In the example illustrated in FIG. 2, nodes 2 and 5 are assigned to the earliest time step, i.e., time step 1, nodes 1 and 3 to time step 2, and node 4 to time step 3.

Then, in Step 2, ALAP scheduling is performed. Specifically, each of a plurality of nodes included in a control flow graph is assigned to a latest time step possible on the condition that a predetermined dependency between the nodes is satisfied.

FIG. 3 illustrates the results of an exemplary ALAP scheduling operation. In the example illustrated in FIG. 3, nodes 1 and 4 are assigned to the latest time step, i.e., time step 5, nodes 3 and 5 to time step 4, and node 2 to time step 3.

As a result of the ASAP and ALAP scheduling operations, the initial list of scheduling candidates for each node is determined. The term "scheduling candidate (of a node)" as used herein refers to a time step to which the node may possibly be assigned.

FIG. 4 illustrates the initial list of scheduling candidates for each node, with each scheduling candidate being denoted by a black box. For example, node 1 is assigned to time step 2 in the ASAP scheduling and to time step 5 in the ALAP scheduling. This means that node 1 may possibly be assigned to any of time steps 2–5. Therefore, the initial list of scheduling candidates for node 1 includes time steps 2–5 as indicated by the black boxes in FIG. 4. FIG. 4 also illustrates the initial lists of scheduling candidates for the other nodes 2–5.

Then, in Step 3 (FIG. 1), the probability for a node to be assigned to a time step is calculated for each node for each time step. In the example illustrated in FIG. 4, node 1 may possibly be assigned to any of four time steps, i.e., time steps 2–5. Therefore, a probability of ¼ is given to each of the scheduling candidates for node 1, i.e., time steps 2–5.

FIG. 5 illustrates the results of an exemplary probability calculation operation for nodes 1–5.

Then, in Step 4 (FIG. 1), the probabilities of the nodes are summed together for each time step.

FIG. 6 illustrates the results of an exemplary probability summing operation for time steps 1–5. For example, for time step 1, the probability for node 2 to be assigned to time step 1 is ⅓ and the probability for node 5 to be assigned to time step 1 is ¼. Therefore, the sum of probabilities for time step 1 is ⅓+¼=0.58. FIG. 6 also illustrates the sums of probabilities for the other time steps calculated in the same manner.

Then, in Step 5 (FIG. 1), the maximum value is calculated among the sums of probabilities calculated in Step 4. In the example illustrated in FIG. 6, the value 1.5 is selected among 0.58, 1.16, 1.5, 1.16 and 0.58 as the maximum value of the sum of probabilities. In FIG. 6, the sum of probabilities of 1.5 for time step 3 is circled to indicate that the value 1.5 is the maximum value.

Then, in Step 6 (FIG. 1), node(s) (B) each having scheduling candidate (A) in the time step for which the maximum value of the sum of probabilities is calculated in Step 5 is retrieved, and combinations of node (B) and scheduling candidate (A) are obtained.

Figure 7:
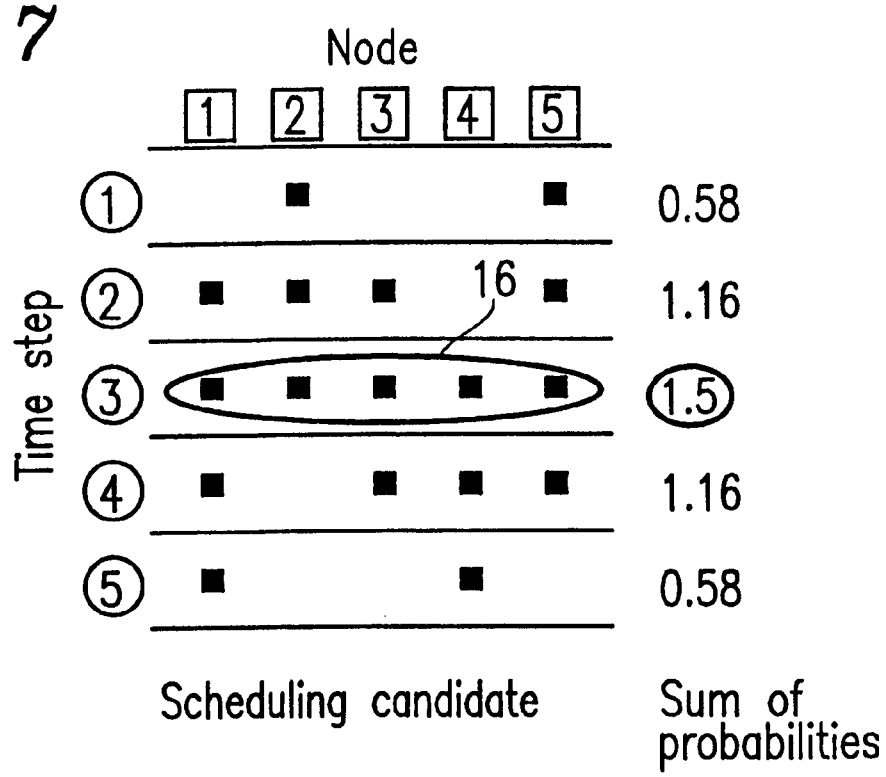
FIG. 7 illustrates the results of an exemplary operation of retrieving combinations of node (B) having scheduling candidate (A) in the time step for which the sum of probabilities is maximum and scheduling candidate (A)

FIG. 7 illustrates the results of an exemplary operation of retrieving nodes (B) each having scheduling candidate (A) in the time step for which the sum of probabilities is maximum. In the example illustrated in FIG. 7, since the sum of probabilities is maximum for time step 3, all nodes (i.e., nodes 1 to 5) having a scheduling candidate in time step 3 are retrieved. As a result, the following combinations are obtained: (node 1, time step 3), (node 2, time step 3), (node 3, time step 3), (node 4, time step 3), and (node 5, time step 3).

Then, in Step 7 (FIG. 1), for each of the combinations obtained in Step 6, node (B) is temporarily assigned to scheduling candidate (A) to estimate the circuit area.

Figure 8:
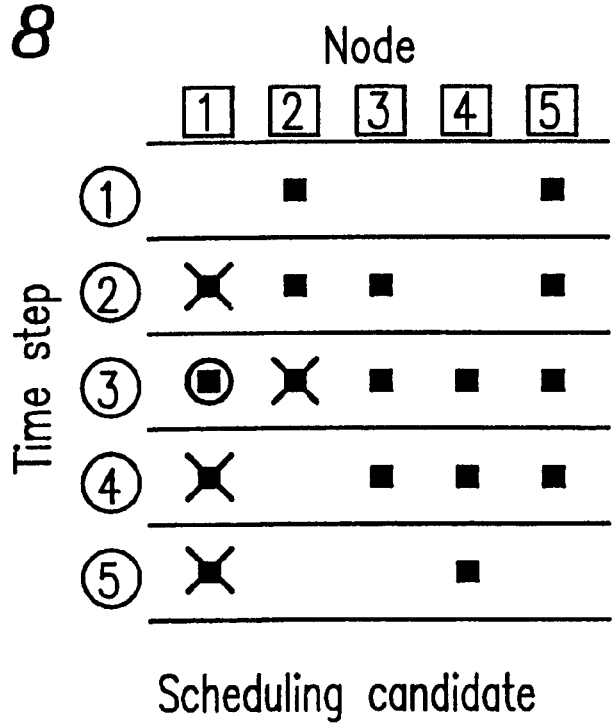
FIG. 8 illustrates an example where a node is temporarily assigned to a time step.

FIG. 8 illustrates an example where node 1 is temporarily assigned to time step 3. After the temporary assignment, there is no probability for node 1 to be assigned to time step 2, 4 or 5, and no probability for node 2 to be assigned to time step 3. Thus, those scheduling candidates are temporarily excluded from the list of scheduling candidates before estimating the circuit area. Similarly, FIGS. 16, 17, 18, 19 respectively illustrate examples where node 2, 3, 4, 5 is assigned to time step 3.

FIG. 9 is a flow chart illustrating a procedure of a method for estimating the circuit area. As illustrated in FIG. 9, Step 13, a temporary assignment is performed to temporarily narrow down the scheduling candidates and then the probability of each node is calculated. Then, in Step 14, the probabilities of the nodes after the temporary assignment are summed together for each time step. Then, in Step 15, the maximum value is calculated among the sums of probabilities calculated. The maximum value is the estimated value of the circuit area.

FIG. 10 illustrates an exemplary circuit area estimation in the case where node 1 is temporarily assigned to time step 3. In the example illustrated in FIG. 10, the estimated value of the circuit area is 1.91. Similarly, FIGS. 20, 21, 22, 23 respectively illustrate exemplary circuit area estimations where node 2, 3, 4, 5 is assigned to time step 3.

Referring again to FIG. 1, Step 8, at least one combination of node (B) and scheduling candidate (A) for which the estimated value of the circuit area as obtained in Step 7 is maximum is retrieved. For the example illustrated in FIG. 7, the estimated value of the circuit area is maximum (1.91) when node 1 is temporarily assigned to time step 3 and when node 5 is temporarily assigned to time step 3. As a result, the combinations (node 1, time step 3) and (node 5, time step 3) are retrieved.

Then, in Step 17, it is determined whether there is more than one combination retrieved in Step 8. If there is more than one combination, the process proceeds to Step 9, and if there is only one combination, the process proceeds to Step 11.

In Step 9, a value of an evaluation function is calculated for each of the combinations.

In the example illustrated in FIG. 7, the estimated value of the circuit area obtained when node 1 is temporarily assigned to time step 3 (1.91) is equal to that obtained when node 5 is temporarily assigned to time step 3, whereby two combinations, i.e., (node 1, time step 3) and (node 5, time step 3), are retrieved in Step 8. Thus, a value of an evaluation function is calculated for each of the combinations. Herein, the evaluation function is as follows:

((the number of inputs of the node)−(the number of outputs of the node))×(the time step number of the scheduling candidate)

As illustrated in FIG. 2 (or FIG. 3), the number of inputs of node 1 is 1 and the number of outputs of node 1 is 1, whereas the number of inputs of node 5 is 2 and the number of outputs of node 5 is 1. Therefore, when node 1 is temporarily assigned to time step 3, the value of the evaluation function is calculated as (1−1)×3=0. When node 5 is temporarily assigned to time step 3, the value of the evaluation function is calculated as (2−1)×3=3. The calculation of the value of the evaluation function will be further discussed below with reference to FIG. 11.

Then, in Step 10, the maximum value is calculated among the values of the evaluation function calculated in Step 9 to retrieve a combination of node (C) and scheduling candidate (D) which give the maximum value. In the example illustrated in FIG. 7, the combination (node 5, time step 3) is retrieved because the value of 3 obtained when node 5 is temporarily assigned to time step 3 is the maximum value of the evaluation function.

Thus, Step 9 and Step 10 are performed only when more than one combination is retrieved in Step 8.

Then, in Step 11, the scheduling candidate (D) is excluded from the list of scheduling candidates of the node (C). If it is determined in Step 17 that there is only one retrieved combination, Step 11 is performed with node (C)=node (B) and scheduling candidate (D)=scheduling candidate (A).

Figure 12:
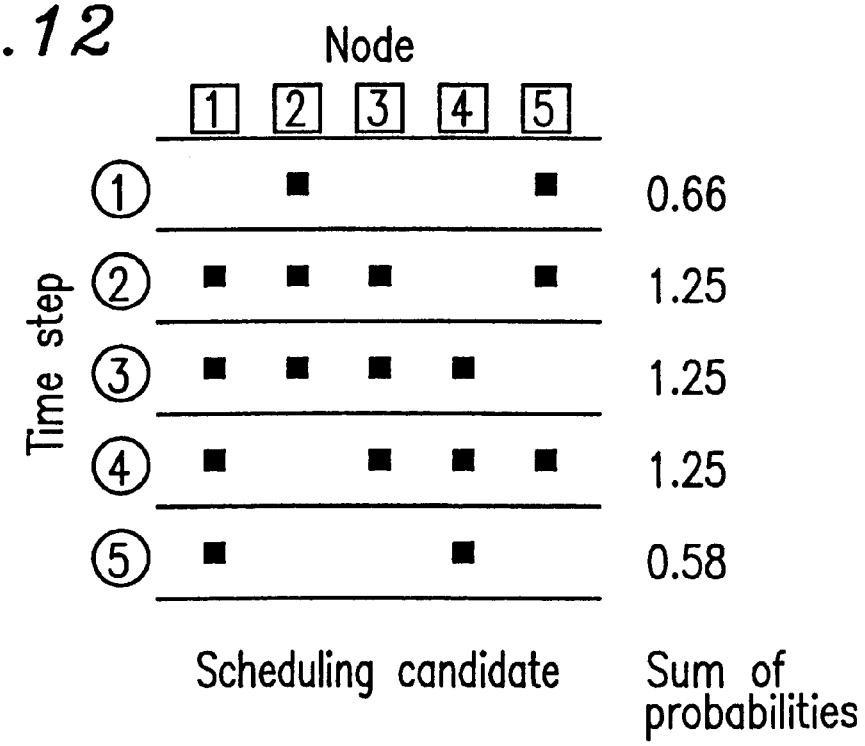
FIG. 12 illustrates an example where a time step is excluded from the list of scheduling candidates of a node.

FIG. 12 illustrates an example where time step 3 is excluded from the list of scheduling candidates of node 5, which means that node 5 will not be assigned to time step 3.

Figure 13:
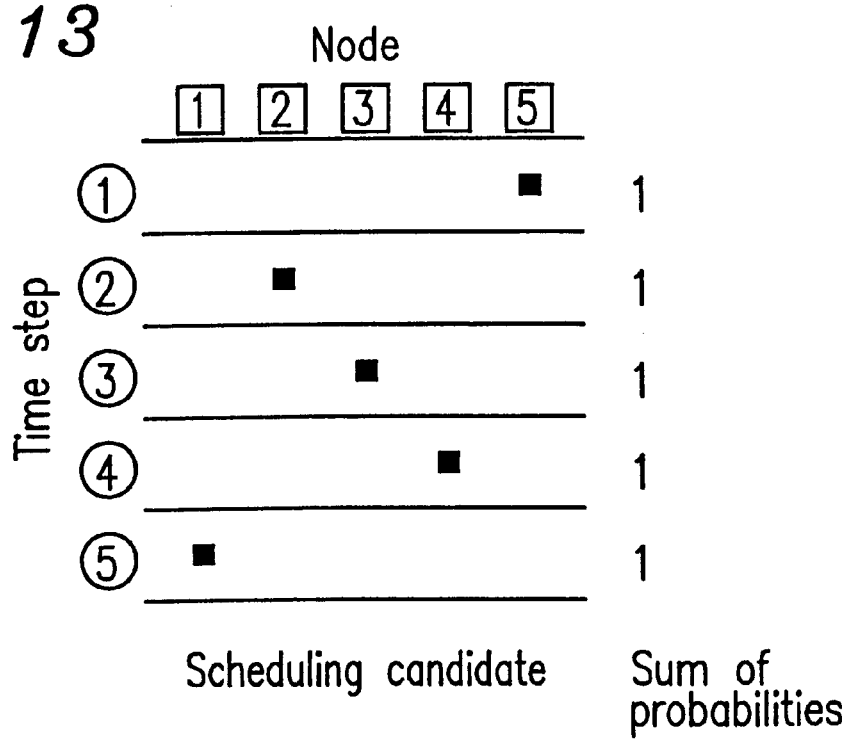
FIG. 13 illustrates an example where each node has only one scheduling candidate.
Figure 14:
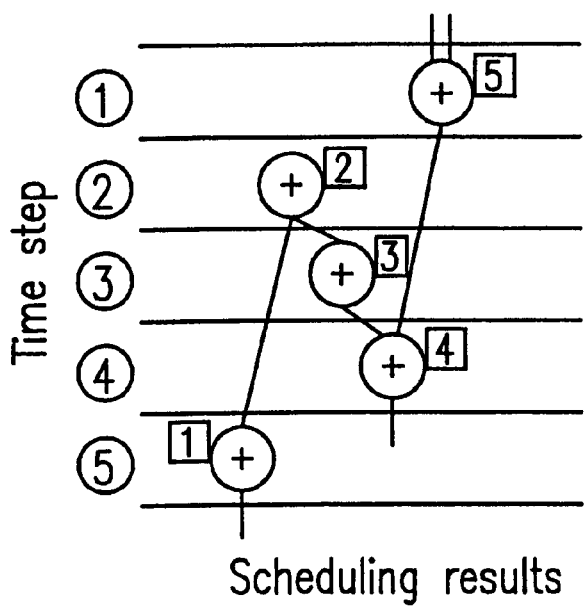
FIG. 14 illustrates the final results of an exemplary scheduling operation.

Steps 3–11 are repeated until scheduling for all nodes are completed with each node having only one scheduling candidate. FIG. 13 illustrates an example where each node has only one scheduling candidate. FIG. 14 illustrates the final results of the exemplary scheduling operation.

Next, a scheduling method according to the present invention where the area of registers is taken into consideration will be described.

Figure 15C:
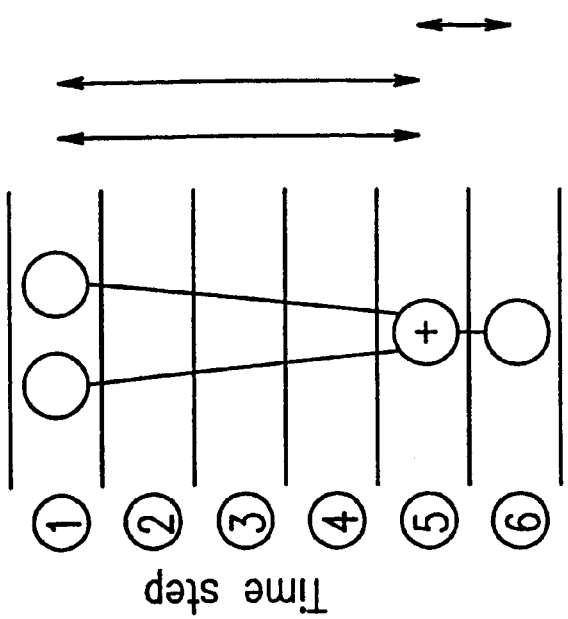
FIGS. 15A to 15C are diagrams illustrating a scheduling operation taking the register area into consideration.
Figure 15B:
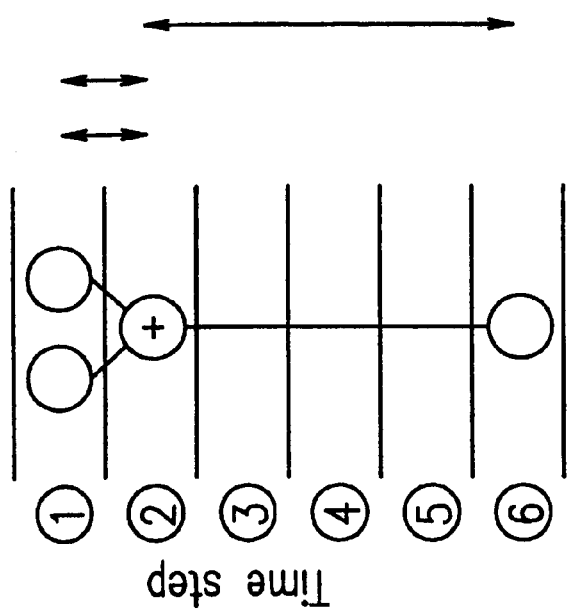
Figure 15A:
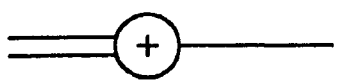
Figure 18:
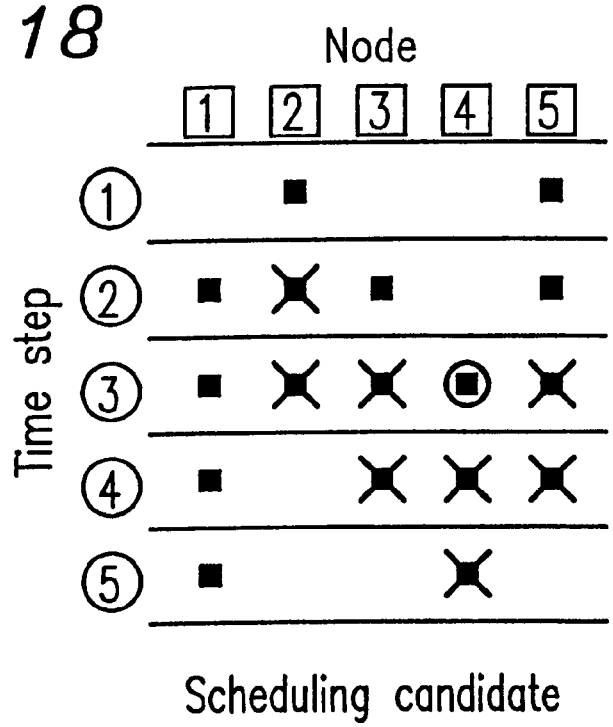
FIG. 18 illustrates an example where a node is temporarily assigned to a time step.
Figure 19:
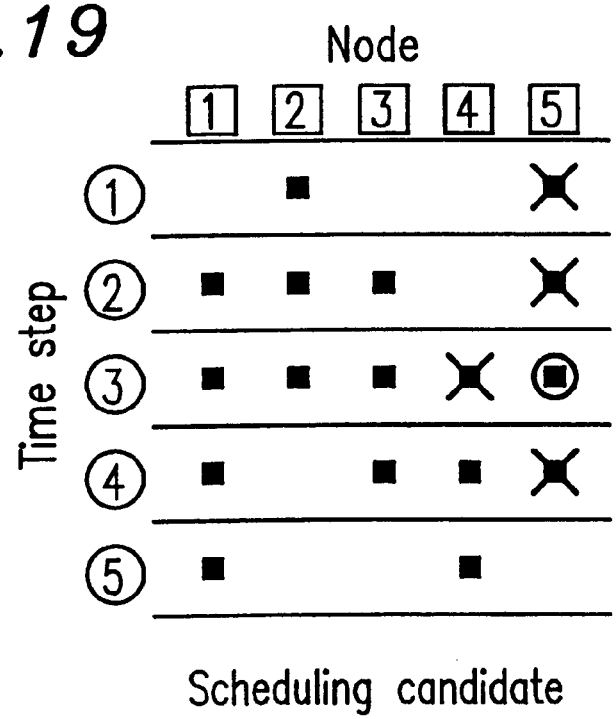
FIG. 19 illustrates an example where a node is temporarily assigned to a time step.

FIGS. 15A to 15C illustrate the scheduling method taking the register area into consideration. FIG. 15A illustrates an addition node. Each of FIGS. 15B and 15C illustrates an example of how the addition node of FIG. 15A is scheduled. In the example illustrated in FIG. 15B, the addition node is scheduled to time step 2. In such a case, the two branches connected to the respective inputs of the addition node have a lifetime ranging from time step 1 to time step 2, and the single branch connected to the output of the addition node has a lifetime ranging from time step 2 to time step 6. In the example illustrated in FIG. 15C, the addition node is scheduled to time step 5. In such a case, the two branches connected to the respective inputs of the addition node have a lifetime ranging from time step 1 to time step 5, and the single branch connected to the output of the addition node has a lifetime ranging from time step 5 to time step 6.

Thus, with the scheduling operation as illustrated in FIG. 15B, two lifetimes span a one-step interval, and one lifetime spans a four-step interval. On the other hand, with the scheduling operation as illustrated in FIG. 15C, two lifetimes span a four-step interval, and one lifetime spans a one-step interval. Therefore, the scheduling operation of FIG. 15B is more likely to require a smaller number of registers than that required by the scheduling operation of FIG. 15C.

Figure 11:
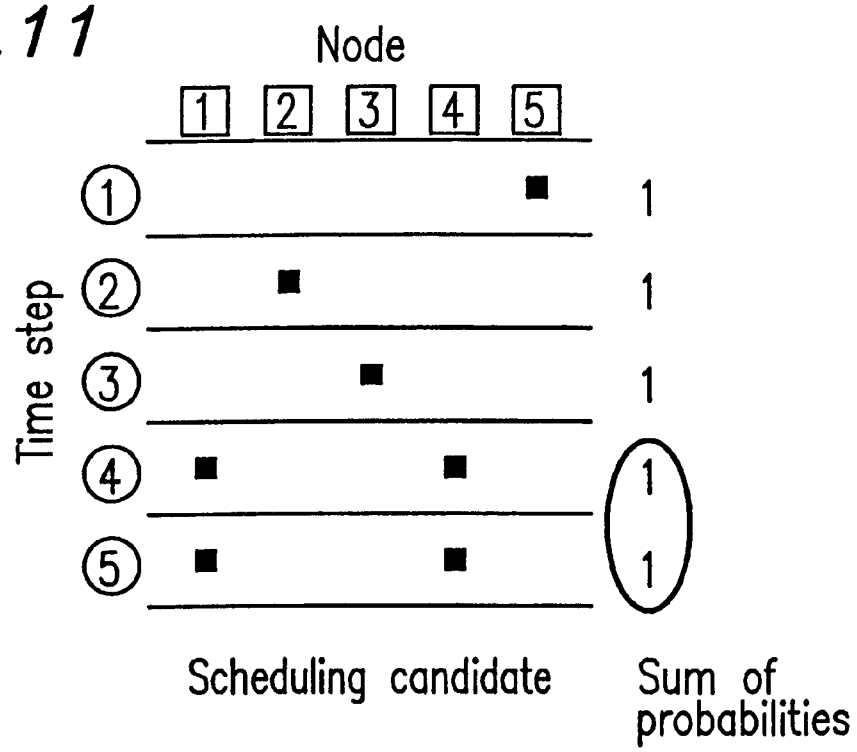
FIG. 11 is a diagram illustrating a calculation of a value of an evaluation function.

FIG. 11 is a diagram illustrating a calculation of a value of an evaluation function. It is assumed that as illustrated in FIG. 11, the estimated value of the circuit area is the same in all of the following cases (1)–(4): (1) where node 1 is temporarily assigned to time step 4; (2) where node 1 is temporarily assigned to time step 5; (3) where node 4 is temporarily assigned to time step 4; and (4) where node 4 is temporarily assigned to time step 5. In such a case, the value of the evaluation function is calculated for each of the combination of a node and a scheduling candidate as follows. The value of the evaluation function for case (1), where node 1 is temporarily assigned to time step 4, is calculated as (1−1)×5=0. Similarly, for the other three cases, the value of the evaluation function is calculated as (1−1)×5=0 for case (2), (2−1)×4=4 for case (3), and (2−1)×5=5 for case (4).

In Step 10 illustrated in FIG. 1, a combination of node (C) and scheduling candidate (D) for which the value of the evaluation function is maximum, and then the scheduling candidate (D) is excluded from the list of scheduling candidates of the node (C). In the example illustrated in FIG. 11, time step 5 is excluded from the list of scheduling candidates of node 4. This means that node 4 will not be assigned to time step 5. In this way, node 4, which has more inputs than its outputs, is assigned to an earlier time step than node 1, which has an equal number of inputs and outputs.

As discussed above, according to the present invention, a node which has less inputs than its outputs is scheduled to a later time step if the estimated value of the circuit area is the same as that obtained with a node having more inputs than its outputs. On the other hand, a node which has more inputs than its outputs is scheduled to an earlier time step if the estimated value of the circuit area is the same as that obtained with a node having less inputs than its outputs. In this way, it is possible to perform a scheduling operation which takes the register area into consideration, so that the number of registers required is likely to be reduced.

The scheduling method as illustrated in FIG. 1 may be implemented in the form of a program which can be executed by a computer.

Figure 26:
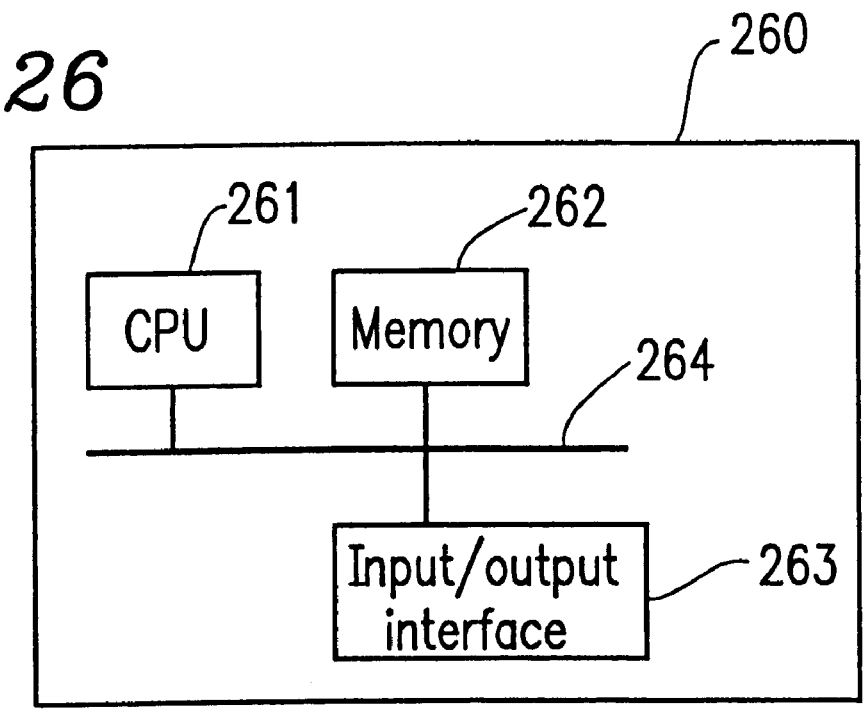
FIG. 26 is a block diagram illustrating a configuration of a computer 260 for executing a program which implements the scheduling method of the present invention.

FIG. 26 illustrates a configuration of a computer 260 for executing the program which implements the scheduling method as illustrated in FIG. 1.

The computer 260 includes a CPU 261, a memory 262, an input/output interface 263 and a bus 264. The CPU 261, the memory 262 and the input/output interface 263 are connected with one another via the bus 264. The input/output interface 263 is configured so that it can be connected to an input/output unit (not shown).

The program implementing the scheduling method as illustrated in FIG. 1 (hereinafter, referred to as the "scheduling program") is stored in, for example, the memory 262. Alternatively, the scheduling program may be recorded on any type of recording medium such as a magnetic disk or an optical disk. The scheduling program recorded on such a recording medium is loaded to the memory 262 of the computer 260 via the input/output unit (e.g., a disk drive). The computer 260 serves as a scheduling apparatus for performing the scheduling method of FIG. 1 by the CPU 261 executing the scheduling program.

Finally, a distinction of the present invention over a conventional technique will be discussed with reference to FIGS. 16, 20, 24 and 25. Herein, Japanese Laid-Open Publication No. 9-81605 will be discussed as an exemplary conventional technique.

According to the present invention, the estimated value of the circuit area is calculated with node (B) which has scheduling candidate (A) in the time step for which the sum of probabilities is maximum having been temporarily assigned to scheduling candidate (A). FIG. 16 illustrates scheduling candidates obtained with node 2 having been temporarily assigned to time step 3. FIG. 20 illustrates the estimated value of the circuit area calculated with node 2 having been temporarily assigned to time step 3.

Figures 24, 25:
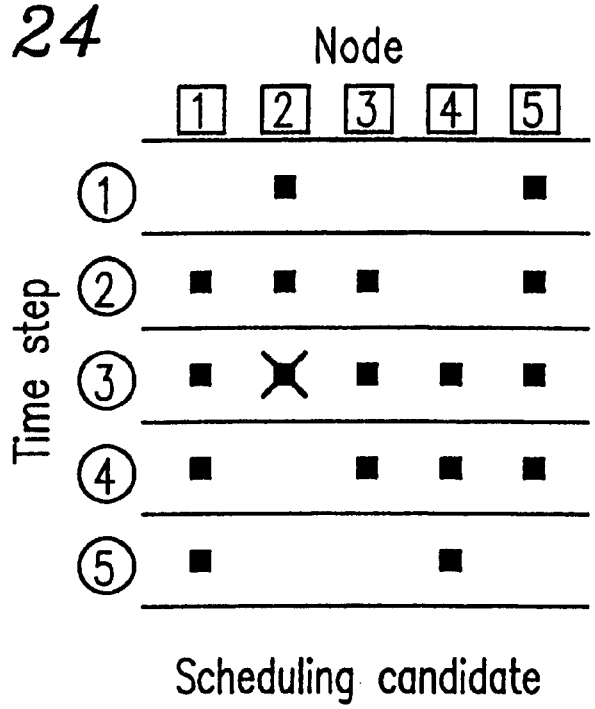
FIG. 24 illustrates scheduling candidates with a node having been excluded from assignment to a time step according to a conventional technique.
FIG. 25 illustrates the results of an exemplary area estimation operation with the node having been excluded from assignment to the time step according to the conventional technique.

On the contrary, according to the algorithm described in Japanese Laid-Open Publication No. 9-81605, the estimated value of the circuit area is calculated for each node (B) having scheduling candidate (A) in the time step for which the sum of probabilities is maximum, with the scheduling candidate (A) having been excluded from the list of scheduling candidates of the node (B). FIG. 24, illustrates scheduling candidates with node 2 having been excluded from assignment to time step 3. FIG. 25 illustrates the estimated value of the circuit area calculated with node 2 having been excluded from assignment to time step 3.

Comparison between FIG. 24 and FIG. 16 shows that there are less scheduling candidates in FIG. 16 than in FIG. 24. This indicates that the state of FIG. 16 is closer to the final scheduling result (FIG. 13). Thus, the present invention is capable of estimating the circuit area in a faster and more accurate manner, thereby providing better scheduling results, than the algorithm described in Japanese Laid-Open Publication No. 9-81605.

Moreover, according to the algorithm described in Japanese Laid-Open Publication No. 9-81605, it is not possible to perform a scheduling operation taking into consideration the register area. As described above, according to the present invention, it is possible to perform a scheduling operation taking into consideration the register area.

As described above, the scheduling method for high-level synthesis of the present invention calculates, for each time step, the sum of the respective probabilities for a plurality of nodes included in a control flow graph to be assigned to the time step. Then, the scheduling method calculates the estimated value of the circuit area with node (B) which has scheduling candidate (A) in the time step for which the sum of probabilities is maximum having been temporarily assigned to the scheduling candidate (A). Thus, it is possible to estimate the circuit area in a state closer to the final scheduling result, so that it is less likely that the optimal time step is excluded from the list of scheduling candidates, thereby resulting in a local solution.

Moreover, according to the scheduling method for high-level synthesis of the present invention, if there is more than one combination of a node and a scheduling candidate for which the estimated value of the circuit area is maximum, a value of an evaluation function is calculated for each of the combinations so as to retrieve a combination of node (C) and scheduling candidate (D) for which the value of the evaluation function is maximum and to exclude the scheduling candidate (D) from the list of scheduling candidates of the node (C). Thus, based on the evaluation function, it is possible to select a more desirable scheduling result among a plurality of scheduling results for which the final circuit area is the same.

Furthermore, according to the scheduling method for high-level synthesis of the present invention, a node which has less inputs than its outputs is scheduled to a later time step if the estimated value of the circuit area is the same as that obtained with a node having more inputs than its outputs. On the other hand, a node which has more inputs than its outputs is scheduled to an earlier time step if the estimated value of the circuit area is the same as that obtained with a node having less inputs than its outputs. In this way, it is possible to perform a scheduling operation which takes the register area into consideration, so that the number of registers required is likely to be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A scheduling method for high-level synthesis of a circuit which is represented by an operation description, the method comprising the steps of:
   (a) calculating a probability for each of a plurality of nodes included in a control flow graph to be assigned to a time step;
   (b) calculating a sum of the probabilities for each time step;
   (c) calculating, for each node having a scheduling candidate in a time step for which the sum of probabilities is maximum, an estimated value of an area of the circuit with the node having been temporarily assigned to the scheduling candidate;
   (d) retrieving a combination of a node and a scheduling candidate for which the estimated value is maximum; and
   (e) narrowing down a list of scheduling candidates of the node in the combination by excluding the scheduling candidate in the combination from the list of scheduling candidates of the node in the combination.

2. A scheduling method according to claim 1, further comprising the step of determining whether or not there is more than one combination of a node and a scheduling candidate retrieved in the step (d) for which the estimated value is maximum, wherein:
   if it is determined that there is more than one such combination, then step (e) comprises the steps of:
   (e-1) calculating a value of a predetermined evaluation function for each of the combinations;
   (e-2) retrieving a combination of a node and a scheduling candidate for which the value of the predetermined evaluation function is maximum; and
   (e-3) excluding the scheduling candidate in the combination from the list of scheduling candidates of the node in the combination.

3. A scheduling method according to claim 2, wherein the evaluation function is represented by ((a number of inputs of the node)−(a number of outputs of the node))×(a time step number of the scheduling candidate).

4. A computer-readable recording medium having a program recorded thereon for instructing a computer to execute a scheduling method for high-level synthesis of a circuit which is represented by an operation description, the scheduling method comprising the steps of:
   (a) calculating a probability for each of a plurality of nodes included in.a control flow graph to be assigned to a time step;
   (b) calculating a sum of the probabilities for each time step;
   (c) calculating, for each node having a scheduling candidate in a time step for which the sum of probabilities is maximum, an estimated value of an area of the circuit with the node having been temporarily assigned to the scheduling candidate;
   (d) retrieving a combination of a node and a scheduling candidate for which the estimated value is maximum; and
   (e) narrowing down a list of scheduling candidates of the node in the combination by excluding the scheduling candidate in the combination from the list of scheduling candidates of the node in the combination.

* * * * *